United States Patent

Jeon et al.

[11] Patent Number: 5,956,384
[45] Date of Patent: Sep. 21, 1999

[54] APPARATUS AND METHOD FOR AUTOMATICALLY DETECTING DEFECTIVE LINES IN A CABLE AND FOR AUTOMATICALLY SWITCHING FROM THE DEFECTIVE LINE TO AN EXTRA LINE

[75] Inventors: Dae Soo Jeon; Du Hwan Chun, both of Suwon, Rep. of Korea

[73] Assignee: Samsung Electronics Co., Ltd., Kyungki-do, Rep. of Korea

[21] Appl. No.: 08/024,299

[22] Filed: Mar. 1, 1993

[30] Foreign Application Priority Data

Feb. 29, 1992 [KR] Rep. of Korea .......................... 92-3396

[51] Int. Cl.$^6$ .................................................. H04L 12/00
[52] U.S. Cl. ................................................. 379/22; 370/16
[58] Field of Search .................................. 379/22, 25, 26; 370/16; 364/480

[56] References Cited

U.S. PATENT DOCUMENTS

| | | | |
|---|---|---|---|
| 3,742,154 | 6/1973 | Bidlack et al. | 379/22 |
| 4,306,313 | 12/1981 | Baldwin | 379/22 |
| 4,623,884 | 11/1986 | Ihara et al. | 370/16 |
| 5,153,874 | 10/1992 | Kohno | 370/16 |
| 5,218,465 | 6/1993 | Lebby et al. | 370/16 |

*Primary Examiner*—Thomas R. Peeso
*Attorney, Agent, or Firm*—Sughrue, Mion, Zinn, Macpeak & Seas, PLLC

[57] ABSTRACT

An automatic broken cable detecting and switching apparatus and a method therefore. The apparatus includes a transmitting microprocessor for controlling the abnormality of the cable, a transmitting line selecting section for selecting the transmitting lines, a warning display section for displaying a warning upon finding an abnormality, a transmitting data processing section, a transmitting multi-channel demultiplexor for demultiplexing, a transmitting cable connecting section, a multi-core cable, receiving microprocessor, a receiving cable connecting section, a receiving multi-channel multiplexor, a receiving line selecting section, and a receiving signal processing section. When a line is broken during use, the abnormality is immediately searched to find the defective line. Thereafter, a new line is substituted for the thus detected defective line so that data transmission and reception can continue with a minimal delay.

8 Claims, 4 Drawing Sheets

APPARATUS AND METHOD FOR AUTOMATICALLY DETECTING DEFECTIVE LINES IN A CABLE AND FOR AUTOMATICALLY SWITCHING FROM THE DEFECTIVE LINE TO AN EXTRA LINE

BACKGROUND OF THE INVENTION

FIELD OF THE INVENTION

The present invention relates to an apparatus for automatically detecting the occurrence of a defective or broken cable and for automatically switching the data transmission from the broken cable to another cable and a method therefor. Particularly, the present invention relates to an apparatus and a method, in which, when a defect or breakage is discovered in a multi-core cable during data transmission or receiving, the defect is displayed, and an extra cable in reserve is automatically switched into use, so that the data transmission or receiving can be continued.

BACKGROUND

Generally, there are two techniques for transmitting and receiving data. One technique involves transmitting data through a cable while the other does not involve a cable. The present invention concerns the former technique where a cable is used for transmission.

Conventionally, when data or information signals are transmitted or received through a cable, it is impossible to immediately resume the data transmission or receiving if the cable is broken. It is also impossible to determine whether the transmission failure is due to a failure of the transmitting and receiving apparatus or to breakage of the cable.

Further, even when it is determined that the transmission failure involves a cable line, it is necessary to determine which one of a plurality of cable lines is broken.

In order to resume the transmission or receiving of data it is necessary that the appropriate cable line be repaired. However, due to the above difficulties associated with diagnosing the problem, it is virtually impossible to correct the problem in a relatively short time period. For this reason, urgent data transmission and receiving needs are usually not met.

SUMMARY OF THE INVENTION

The present invention is intended to overcome the disadvantages of the conventional technique.

Therefore, it is an object of the present invention to provide a data transmitting and receiving apparatus and a method thereof, in which a microprocessor automatically checks for the presence of a defect in each of the cable lines and converts from the thus detected defective cable line to another, extra cable line so that the data transmission and receiving can be carried out continuously. As a result, an urgent repair of the cable is not required during transmission and reception of urgent data, thereby making it possible to carry out data transmission and receiving reliably and efficiently.

In achieving the above object, the apparatus of the present invention, which is capable of automatically detecting and switching from a defective cable by employing a microprocessor, includes: a determining section for determining the presence of an abnormality during the power-on period; a warning display section for displaying the defective line after sequential checking of the lines; a line selecting section for switching from the defective line to an extra line; a checking section for checking the new line after the switching from the defective line; and a controlling section for automatically controlling the resumption of the data transmission after the completion of the checking.

In achieving the above object, the method of automatically switching to an extra line in the apparatus of the present invention, includes a step S1 of electrically interconnecting a transmitting microprocessor, a transmission line, and a receiving microprocessor; a system initialing step S2 of designating the start address of a main line in use and the start address of an extra line, and clearing the system to a line count="0", and a defective line count="0", as well as setting the total number of the lines; a step S3 of transmitting test signals from the transmitting microprocessor and checking the presence of an abnormality in each of the lines in accordance with the signals returned from the receiving microprocessor; a step S4 of judging the presence of an abnormality in the lines after carrying out the step S3; a step S5 of conducting a first subroutine upon finding an abnormality in step S4, and checking as to whether the line count is the final value if no abnormality is discovered; a step S6 of automatically switching the abnormal line to an extra line after carrying out the step S5; a step S7 of comparing the setting value of the system initializing step S2 with the value after the step S6 to confirm whether it is the final value, and returning the system to the step S3 if it is not the final value; a step S8 of shifting the output connection upon finding the final value at the step S7; and a step S9 of converting the system to the signal transmitting mode.

BRIEF DESCRIPTION OF THE DRAWINGS

The above object and other advantages of the present invention will become more apparent by considering the following detailed description of the preferred embodiment of the present invention with reference to the attached drawings in which.

DESCRIPTION OF THE PREFERRED EMBODIMENT

The preferred embodiment of the apparatus for detecting and switching a broken cable according to the present invention will be described in detail referring to the attached drawings.

Figure 1:
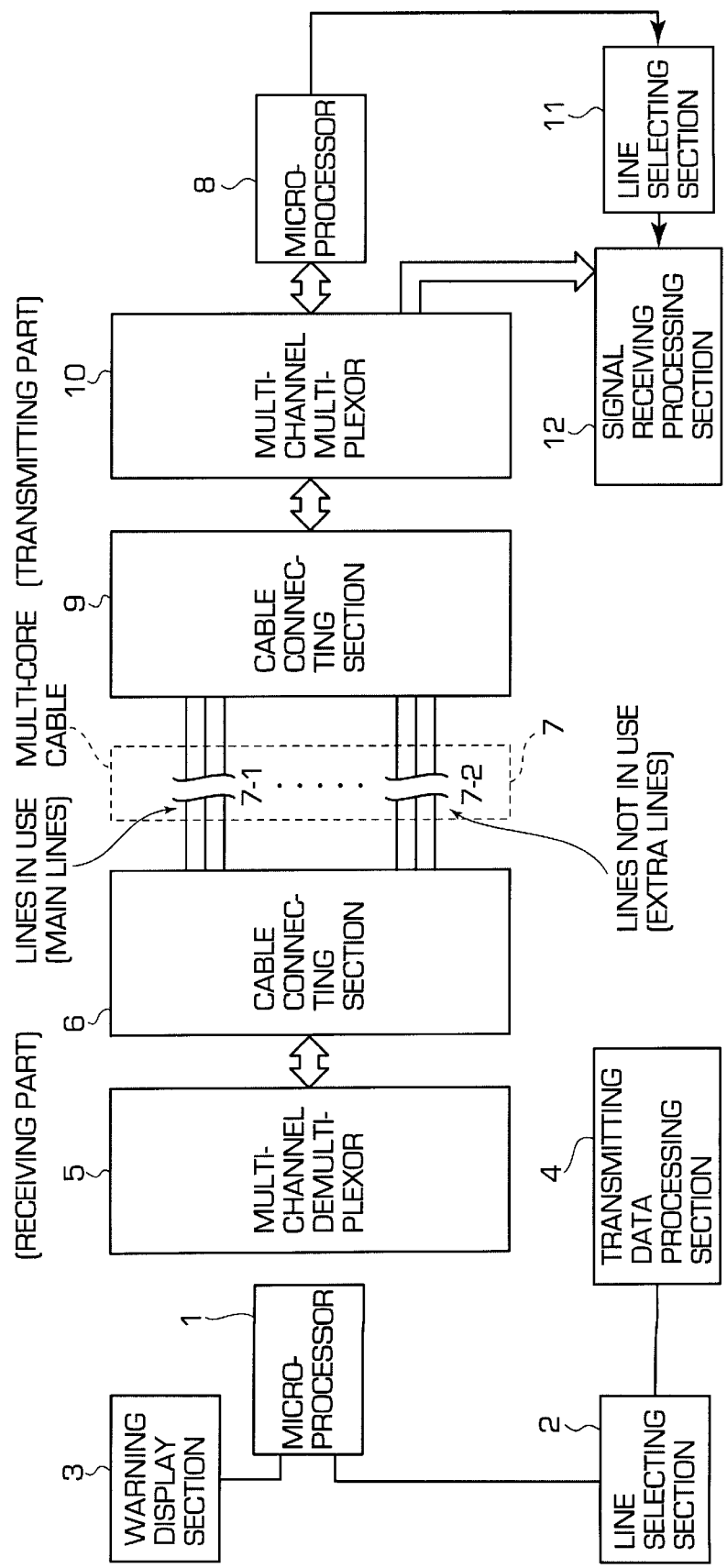
FIG. 1 is a block diagram showing the constitution of the apparatus of the present invention.

FIG. 1 is a block diagram showing the constitution of the automatic broken cable detecting apparatus of the present invention. A transmitting microprocessor 1 is connected to a line selecting section 2 so as to control transmitting lines, while a transmitting data signal processing section 4 is connected in such a manner as to be opened by the output signals of the line selecting section 2.

Further, a multi-channel demultiplexor 5 is connected to exchange data and control signals with the transmitting microprocessor 1, and to receive the output signals from the transmitting signal data processing section 4. Further, a cable connecting section 6 of the transmitting portion is so connected as to exchange signals with the multi-channel demultiplexor 5, and the section 6 is also connected to a multi-core cable and extra lines 7.

Meanwhile, a receiving microprocessor 8, which responds to the test signals of the transmitting microprocessor 1, is connected to a receiving line selecting section 11 to control the receiving line, and is also connected to a multi-channel multiplexor 10 to exchange control signals therewith. The multi-channel multiplexor 10 is connected to a cable connecting section 9 of the receiving portion from the multi-core cable to exchange signals therewith. A receiving signal processing section 12 is so connected as to receive the output signals of the multi-channel multiplexor in accordance with the output signals of the line selecting section 11 of the receiving portion which selects lines under the control of the receiving microprocessor 8.

The apparatus of the present invention constituted as above will now be described as to its operation and effects.

When the system power is turned on, the transmitting microprocessor 1 and the receiving microprocessor 8 carry out an abnormality checking routine in the following manner. That is, transmitting microprocessor 1 sends a control signal through the line selecting section 2 to turn off the transmitting data processing section 4.

Through such control signals, the transmitting microprocessor 1 and the receiving microprocessor 8 exchange signals with each other.

When the system is completely ready to carry out the abnormality checking routine, the system initializing step is carried out. That is, the microprocessor 1 designates the start address of a multi-core cable 7-1 (i.e., the main line) and an extra line 7-2, and then the line count is cleared to "0", the broken line count is cleared to "0", and the total number of the lines are set thereupon.

Then the presence of an abnormality in the lines is checked in sequence at the abnormality checking step. The abnormality checking step is carried out in such a manner that the transmitting microprocessor 1 transmits test signals through the respective designated lines and the receiving microprocessor 8 receives them and returns the signals. If there is no responding signal in a particular line, then that line is determined to be abnormal.

The broken line detecting method will be briefly described to facilitate a better understanding of this aspect of the invention. The line selecting section 2 which selects the lines based on the control signals of the transmitting microprocessor 1 enables the transmitting data processing section 4 to select the data to be transmitted. The data which is selected by the transmitting data processing section 4 is input into the multi-channel demultiplexor 5 which demultiplexes it and transmits it to the cable connecting section 6 of the transmitting portion.

The cable connecting section 6 transmits signals through the transmitting line 7-1, which signals are received by the cable connecting section 9 of the receiving portion. The signals which are received by the cable connecting section 9 are then multiplexed by the multi-channel multiplexor 10 and are output to the receiving signal processing section 12 after passing through a designated line by the mutual exchanges of signals with the receiving microprocessor 8. The receiving signal processing section 12 is connected to the line selecting section 11 which selects lines under the control of the microprocessor 8 of receiving portion. The receiving signal processing section 12 processes the output signals of the multi-channel multiplexor 10 in accordance with the above signals.

Now the automatic broken cable detecting method which is carried out by the above constitution will be described with reference to FIG. 1. When the power switch is turned on, the transmitting signal data processing section 4 is opened by the transmitting microprocessor 1 and the transmitting microprocessor 1, the transmitting line 7 and the receiving microprocessor 8 are electrically interconnected. That is, the transmitted signals are transmitted to the cable connecting section 9 of the receiving portion through the multi-channel demultiplexor 5, the cable connecting section 6 and the multi-core cable 7.

Meanwhile, at the receiving portion, the signals which are received at the cable connecting section 9 are input into the receiving signal processing section 12 after passing through the multi-channel multiplexor 10 which exchanges information with the microprocessor of the receiving portion. Under this condition, the receiving microprocessor 8 transmits a control signal to the line selecting section 11, so that the section 11 can receive the signals from the receiving signal processing section.

Figure 2:
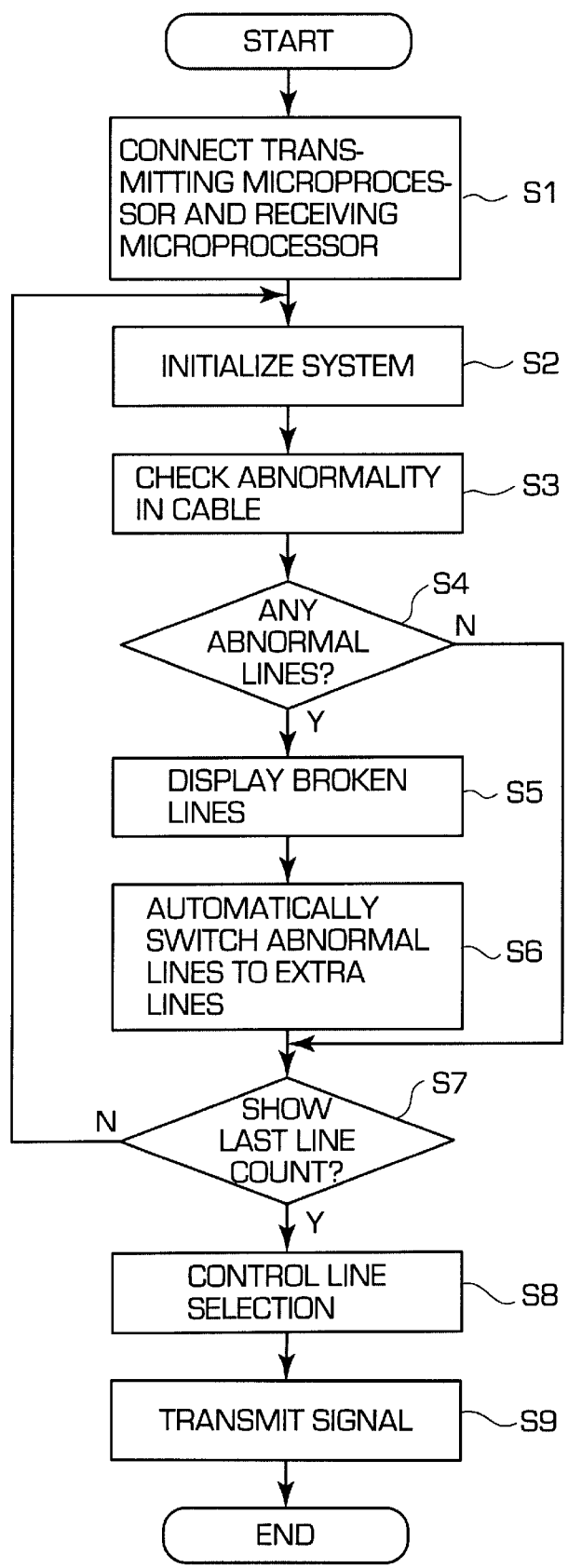
FIG. 2 is a main flow chart showing the constitution of the automatic defective cable detecting method according to the present invention.

The automatic broken line detecting and switching method which is based on the above constitution will now be described in more detail with reference to FIG. 2.

When the system power is turned on, the transmitting microprocessor 1 activates the transmitting signal data processing section, while the transmitting microprocessor 1, the transmitting cable 7-1 and the receiving microprocessor 8 are interconnected (S1).

During the system initialization, the start addresses of the main cable and the start addresses of extra cables are designated, while the line count and the broken line count are respectively cleared to "0", thereby setting the total number of the lines (S2).

Figure 4:
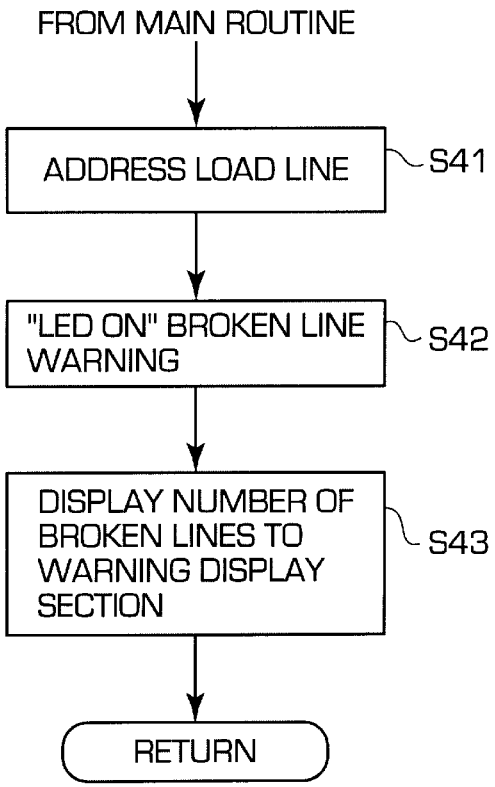
FIG. 4 is a flow chart showing the constitution of the broken line displaying mode of FIG. 2
Figure 5:
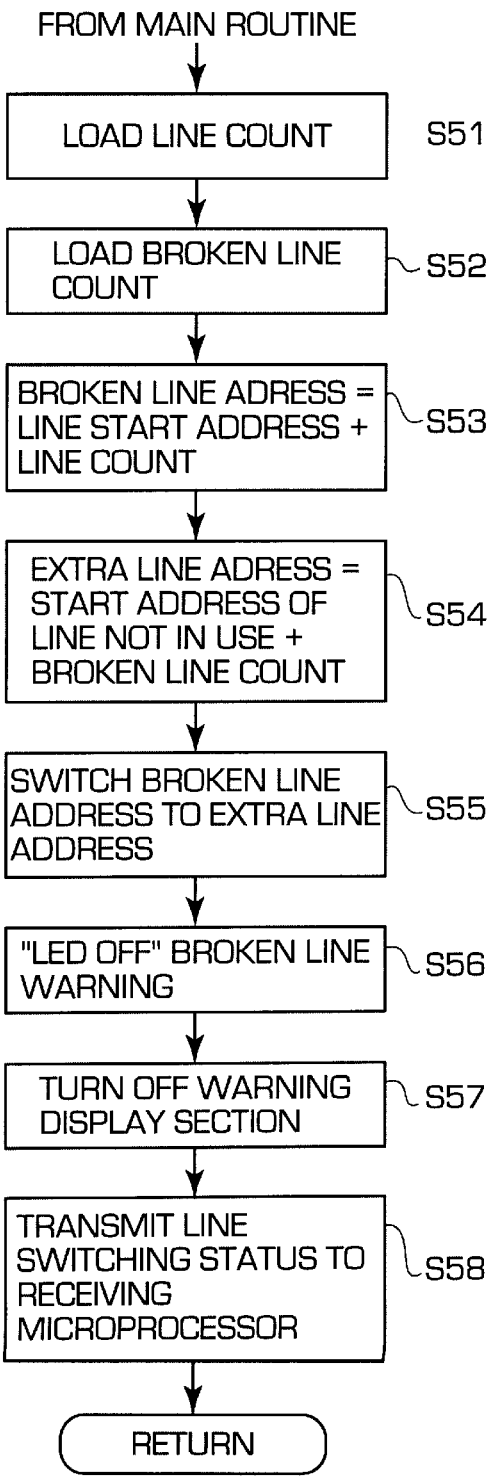
FIG. 5 is a flow chart showing the constitution of the automatic line switching mode of FIG. 2.

Then in the abnormality checking step S3, the sequential checking for the abnormality is carried out in the following manner. The receiving microprocessor 8 transmits response signals as a confirmation of the receipt of the test signals for the designated cable. If there is no such response signal, it is judged that there is an abnormality in the particular line (S4), whereas if there is a response signal, it is judged that there is no abnormality. Then, as shown in FIGS. 4 and 5, a broken line displaying subroutine (S5) and an automatic line switching subroutine are sequentially carried out (S6).

Figure 3:
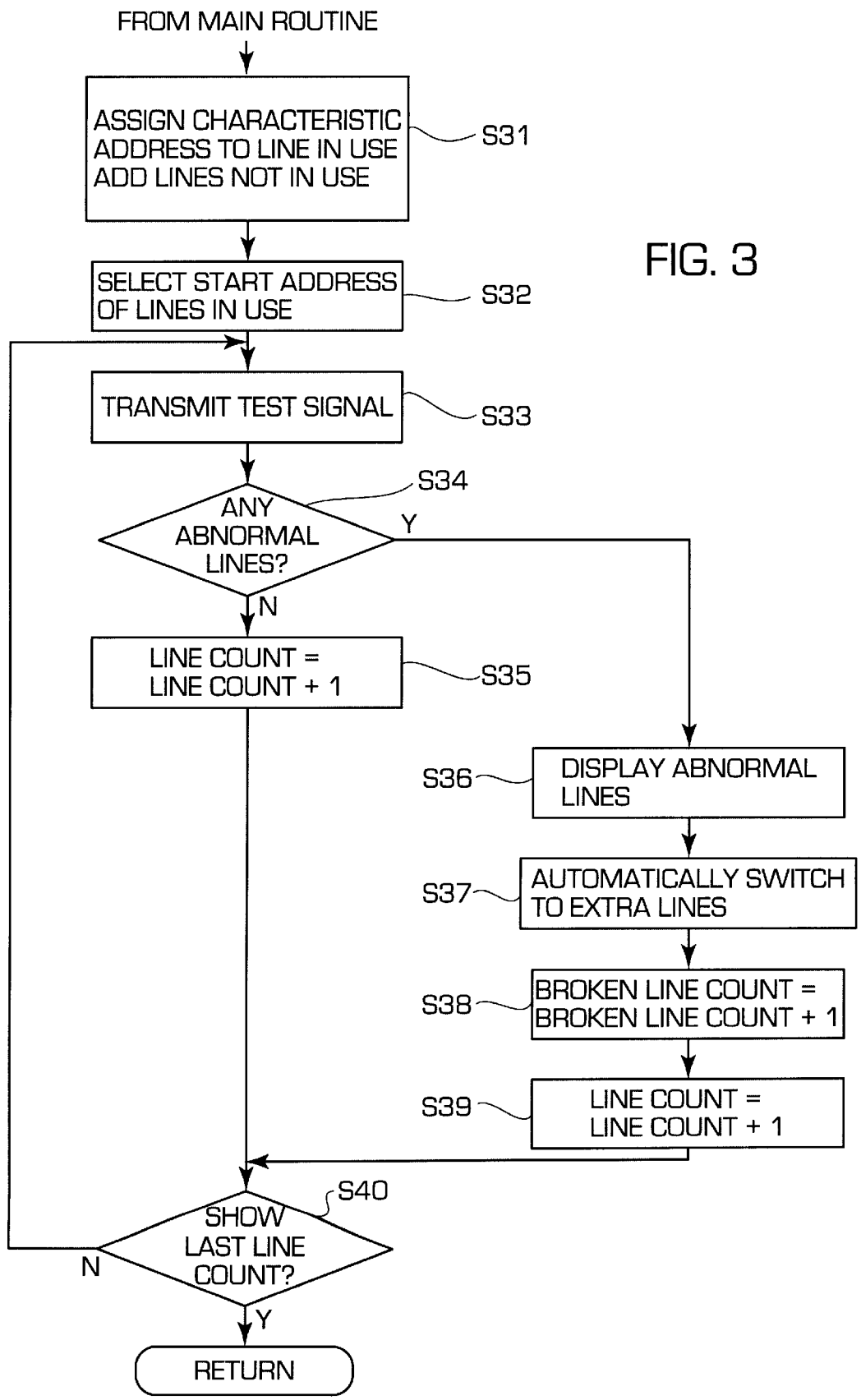
FIG. 3 is a flow chart showing the constitution of the line abnormality checking mode of FIG. 2.

The broken line display mode will now be described with reference to FIGS. 3 and 4. First a characteristic address is assigned to both the cable in use and the cable not in use, and then, the start address of the line in use is selected. Thereafter a test signal is transmitted, and a judgment is made as to whether there is an abnormality. If an abnormality is discovered in a line, the line is displayed and switch is made to an extra line (S5). Then the broken line count and the line count are each increased by one.

After carrying out the above steps, a determination is made as to whether the line count corresponds to the final value. If it does not correspond to the final value, the system is returned to the above described abnormality checking operation. If it is the final value, a control is made for the line selection, and then, the system is returned to a signal transmitting mode.

In relation with the above description, the abnormal line displaying process will be described with reference to FIG. 4. In the case of a broken line, the address of the broken line is loaded (41st step) to activate a broken line displaying LED (42nd step), thereby displaying the broken line number to the warning display section (43rd step).

The broken line displaying subroutine as shown in FIG. 5 will now be described. First, the line count and the broken line count are loaded (51st step), and then, the line count is added to the start address of the line, thereby determining the broken line address (52nd step).

Then the broken line count is added to the start address of the line not in use, thereby determining the address of the extra line (54th step). Then the address of the broken line is switched to the address of the extra line, the switching being made sequentially from the start address (55th step).

When the broken line is switched to the extra line, the warning LED is turned off (56th step), and the warning display section is also turned off, while the result of the switching process is transmitted to the microprocessor 8 of receiving part (57th and 58th steps).

Based on the received control data, the microprocessor of the receiving portion controls the line selecting section, so that the input signal connection state of the received signal processing section can be changed.

According to the present invention as described above, an abnormality of such a broken line is automatically checked, and the abnormal line is excluded in favor of normal extra line, so that data can be transmitted and received continuously, thereby allowing for substantial instantaneous correction of the problem.

What is claimed is:

1. An automatic broken cable detecting and switching apparatus, comprising:
    means for discovering the presence of a defective line of a cable having a plurality of lines during a power-on period by sequentially checking each of said lines;
    warning display means for displaying an identification of the defective line upon said discovery;
    line selecting means for automatically switching transmission of data from said defective line to another line;
    means for again checking the presence of a defect in other lines of the cable after switching said defective line to said another line; and
    means for automatically resuming transmission of data upon completion of the checking.

2. The apparatus of claim 1, wherein said discovering means comprises transmitting means for transmitting a signal through each of said plurality of lines and receiving means for receiving said transmitted signal and for outputting a confirmation signal if said transmitted signal is received, wherein when a confirmation signal is not outputted by said receiving means it is determined that the line through which the corresponding transmitting signal was sent is defective.

3. An automatic broken cable detecting and switching apparatus, comprising:
    a transmitting microprocessor for transmitting control signals to select transmitting lines among a plurality of lines, for transmitting checking signals to check abnormalities in the lines, for initializing the system after providing a warning signal upon discovering an abnormality in at least one of said lines and for outputting warning signals;
    transmitting line selecting means for selecting said transmitting lines in accordance with the control signals of said transmitting microprocessor and for outputting corresponding output signals;
    warning display means for displaying a warning in response to said warning signals received from said transmitting microprocessor;
    transmitting data processing means for receiving the output signals of said transmitting line selection means, and for transmitting proper output data signals;
    a transmitting demultiplexor connected to said transmitting microprocessor for receiving the output data signals of said transmitting data processing means, for demultiplexing said data signals and for outputting demultiplexed signals;
    transmitting cable connecting means connected to said transmitting multi-channel demultiplexor for outputting the demultiplexed signals received from said transmitting demultiplexor;
    a multi-core cable for transmitting the demultiplexed signals of said transmitting cable connecting means;
    a receiving microprocessor for receiving the checking signals from said transmitting microprocessor during the power-on period and for responding thereto, and for providing control signals to control the receiving lines of the cable;
    receiving cable connecting means for receiving said demultiplexed signals transmitted through said multi-core cable;
    a receiving multi-channel multiplexor connected to said receiving, microprocessor for receiving output signals of said receiving cable connecting means and for multiplexing said output signals;
    receiving line selecting means controlled by said receiving microprocessor; and
    receiving signal processing means for receiving output signals of said receiving line selecting means under the control of said receiving microprocessor to change the inputting of the output signals of said receiving multi-channel multiplexor.

4. The automatic broken cable detecting and switching apparatus as claimed in claim 3, wherein said transmitting microprocessor designates start addresses of said multi-core cable and start addresses of extra lines, clears the line count and the broken line count to "0" respectively, and sets the total number of lines.

5. An automatic abnormal line detecting method using an apparatus including a transmitting microprocessor, a multi-core cable having a plurality of transmitting lines and a receiving microprocessor, said method comprising the steps of:
    actuating said apparatus to electrically connect said transmitting microprocessor and said receiving microprocessor via said cable so as to enable the transfer of signals;
    initializing the apparatus for designating start addresses of a main line in use and start addresses of an extra line not in use, clearing a line count and an abnormal line count to "0", and setting a total number of the lines corresponding to a final line count value;
    transmitting test signals by said transmitting microprocessor to the addresses of a designated line thereby checking the presence of an abnormality in the line;
    judging the presence of an abnormality;
    automatically switching the abnormal line to an extra line if an abnormality in said line is found;
    increasing said line count a predetermined amount;
    comparing the current line count with the line count set at said initializing step to determine whether the current line count is the final value, and returning the system to said transmitting step if it is determined that said current line count is not the final value; and
    converting said system to the signal transmitting mode if it is determined that the current line count is the final value.

6. The automatic abnormal line detecting method as claimed in claim 5, further comprising the step of displaying said abnormal line upon discovery thereof.

7. The automatic abnormal line detecting method as claimed in claim 6, wherein said displaying step comprises the steps of:

recognizing the address of the abnormal line;

turning on an abnormal line warning LED; and displaying the number of the abnormal line to said warning display means.

8. The automatic abnormal line detecting method as claimed in claim 7, wherein said automatic line switching step comprises the steps of:

equalizing the address of the abnormal line to the start addresses of the lines plus the line count value;

equalizing the address of the extra line to the start address of the line not in use plus the abnormal line count;

switching the address of the abnormal line to the address of the extra line;

turning off said abnormal line warning LED;

turning off the display of said warning display means; and transmitting the line switching results to said receiving microprocessor.

* * * * *